United States Patent [19]

Vora

[11] Patent Number: 4,764,480
[45] Date of Patent: Aug. 16, 1988

[54] PROCESS FOR MAKING HIGH PERFORMANCE CMOS AND BIPOLAR INTEGRATED DEVICES ON ONE SUBSTRATE WITH REDUCED CELL SIZE

[75] Inventor: Madhukar B. Vora, Los Gatos, Calif.

[73] Assignee: National Semiconductor Corporation, Santa Clara, Calif.

[21] Appl. No.: 113,417

[22] Filed: Oct. 23, 1987

Related U.S. Application Data

[63] Continuation of Ser. No. 946,108, Dec. 22, 1986, abandoned, which is a continuation of Ser. No. 718,392, Apr. 1, 1985, abandoned.

[51] Int. Cl.$^4$ .................. H01L 21/22; H01L 21/225
[52] U.S. Cl. ........................ 437/054; 357/42; 357/91; 437/56; 437/69; 437/162
[58] Field of Search .......... 437/54, 56, 69, 162; 357/42, 91

[56] References Cited

U.S. PATENT DOCUMENTS

| | | | |
|---|---|---|---|
| 4,375,999 | 3/1983 | Nawata | 148/187 |
| 4,384,301 | 5/1983 | Tasch, Jr. et al. | 29/591 |
| 4,445,268 | 5/1984 | Hirao | 29/577 C |
| 4,450,620 | 5/1984 | Fuls et al. | 29/571 |
| 4,462,149 | 7/1984 | Schwabe | 29/571 |
| 4,484,388 | 11/1984 | Iwasaki | 29/571 |
| 4,507,847 | 4/1985 | Sullivan | 29/576 B |
| 4,519,126 | 5/1985 | Hsu | 29/571 |
| 4,536,945 | 8/1985 | Gray et al. | 29/571 |
| 4,569,123 | 2/1986 | Ishii | 29/578 |

OTHER PUBLICATIONS

Momose et al., IEEE-Trans. Electron Devices, vol. ED-32 (1985), 217.
Vora et al, Reprint of a Seminar Talk, Sep. 1984.
Basic I.C. Engineering, ed. Hamilton, D. J., McGraw-Hill, NY, 1975, pp. 198–207.
Microelectronics, ed. Millman, McGraw-Hill, N.Y., 1979, p. 104.

*Primary Examiner*—Upendra Roy
*Attorney, Agent, or Firm*—Lee Patch; Robert C. Colwell

[57] ABSTRACT

There is disclosed a high performance MOS transistor structure of either the N channel or P channel variety and a high performance bipolar transistor structure. A process is disclosed which can make high performance CMOS and high performance bipolar devices on the same die.

9 Claims, 8 Drawing Sheets

P CHANNEL

N CHANNEL

PROCESS FOR MAKING HIGH PERFORMANCE CMOS AND BIPOLAR INTEGRATED DEVICES ON ONE SUBSTRATE WITH REDUCED CELL SIZE

This is a continuation of Ser. No. 946,108, filed Dec. 22, 1986, now abandoned, which is a continuation of Ser. No. 718,392, filed 4/1/85, now abandoned.

BACKGROUND OF THE INVENTION

The invention relates to the field of making MOS or CMOS and bipolar devices on the same integrated circuit die, and, more particularly, to a single poly process utilizing polysilicon contacts to the transistors to minimize device size and silicide to reduce contact resistance.

It has long been known that it is desirable to be able to make CMOS or MOS and bipolar integrated devices on one integrated circuit die. Further, it has long been known that smaller cell sizes reduces the sizes of various parasitic and intrinsic capacitances which are present in all integrated circuits.

In the prior art, various processes to make MOS or CMOS and bipolar devices on the same integrated circuit existed. However, these processes were able to make only high performance bipolar devices or high performance MOS or CMOS devices, but not both. High performances CMOS devices use small amount of power and are small in area and have high yield whereas high performance bipolar devices have very fast switching times and are very small in area and have high yield. High performance MOS devices are small in size and have fast switching times relative to other prior MOS devices and have high yield.

One of the major barriers to accomplishing a process that would yield both high performance CMOS and high performance bipolar devices on the same die has been the increase in cell size and device size made necessary in order to make electrical contact by way of aluminum conductors to nodes in the cell or terminals of the device. It is always necessary in integrated designs to allow clearances for variations from intended feature sizes caused by manufacturing variations in the mask actually generated from that which was specified. Further, because of mask alignment errors in lining up a mask defining one feature that is supposed to fall within the perimeter of another feature, there must be a certain design rule clearance observed around the perimeter of the inner feature as measured to the perimeter of the outer feature. This means, for example, that is a minimum feature size contact hole for a source or drain contact is to be placed within the confines of a source or drain region adjacent a gate region in a MOS device, then the source or drain region must be made at least as being as the contact hole plus the minimum required clearance around the contact hole. This results in a bigger source or drain region than would be necessary if no contact hole for a metal contact line were used and, therefore, a bigger device results.

Further, if metal lines are used to interconnect the various device terminals and circuit nodes in a cell, the cell size will be larger for the same reasons previously outlined because of the necessity of forming a contact hole at every node to be connected to a metal line.

Still further, metal interconnect technology which causes changing levels in the topography of a circuit tends to render a particular technology non-scalable. A particular technology is scalable, if it is planar. That is, if photolithography is carried out on planar surfaces, then no depth of field problem causes distortion of feature sizes. Since, however, metal line contact holes must go all the way down through various preexisting layers to the surface of the silicon, deep holes and severe changes of levels in the topography result. These deep holes cause many problems having to do with metal step coverage and depressions in the surface of the device rendering it non-planar. Trying to do photolithography on a non-planar surface, causes the features sizes which are defined on the surface by the projected light to be distorted from the dimensions desired as defined on the masks through which the light was projected because of loss of clarity at the edges of the image, i.e., the image is in focus at only one distance from the lense. If the "screen" upon which the image is projected is not flat, the image will be out of focus in some areas. This leads to improper resist development. This makes it necessary to use larger clearances in the design rules to prevent the distorted shapes from causing defects. Consequently, the above problem adversely affects device density and renders scaling of the technology down in size by using smaller feature sizes and tighter design rules difficult or impossible.

SUMMARY OF THE INVENTION

The process of the present invention creates both high performance MOS or CMOS and high performance bipolar devices on the same integrated circuit die. The invention is a single poly process which can be used to make a 256K RAM on a die of only 70,000 square mils because of area savings by elimination of contact holes for aluminum conductors to be connected to various nodes of the transistors. That is, the connections to the transistors are made at the single poly level, and many interconnections in the cells designed with both MOS and bipolar devices can be made at the poly level such that there is no need for metal interconnection lines within the cell. Where metal connections are necessary, say to connect cells to other support circuits or other cells in the system, metal lines can be used with their contact holes outside the cell area and going down to the poly/silicide level.

MOS structures of the invention have conventional polysilicon gates with silicide contacts thereto. The isolation island is smaller however than in conventional structures because there are no contract windows through the overlying insulation extending down to source and drain regions in the substrate active region. Instead, doped polysilicon in contact with the source and drain regions with silicide overlying the polysilicon is used for source and drain contacts. This makes a smaller active region possible since no area is consumed either by a source or drain contact hole nor for the design rule clearances necessary around such contact holes.

The process of the invention is an adaptation of a single poly bipolar process. There is substantial overlap in the steps with a few added steps for MOS device formation. This means that bipolar devices and MOS devices can be formed on the same integrated circuit without substantial difficulty.

Beginning with a blank substrate, the conventional buried layers for the bipolar devices and the MOS devices, if desired, are formed in conventional diffusions or by other conventional means. Then an epitaxial layer is gown over the entire wafer surface. Next the device active islands for both MOS and bipolar devices must be formed by some conventional isolation method. In the preferred embodiment, the isolation islands are formed by the well known Fairchild Isoplanar TM II process as described in the literature. Other isolation techniques would also work. Oxide isolation is not the only to isolate the bipolar devices but it is preferred for its advantages in reducing cell suze. Isolation of the MOS devices is not absolutely necessary if only one type of MOS device is being made on the die. MOS devices do not need isolation since the source-substrate diode is cutoff if the source and substrate are connected to the same potential. Further, the drain to substrate diode is also cutoff because of the drain potential relative to the substrate. Therefore current is confined to he channel region and no isolation is necessary for single types of MOS devices. However, if CMOS devices are to be formed on the substrate, then isolation of the p-channel devices from the n-channel devices will be necessary. This can be done essentially for free in the process of the invention since isolation islands must be formed for the bipolar devices anyway.

Following the foregoing steps, a base implant is performed for the bipolar device active regions and for those MOS devices of a channel type requiring a substrate of the opposite conductivity type from that of the existing epitaxial layer. Next, a gate oxide is grown for the MOS devices only, and a layer of poly is deposited over the wafer. Following the poly layer deposition, P+ and N+ implants are performed to dope the poly regions which will later become the source and drain contacts of the MOS devices, the gates thereof and the emitter, base and collector contacts to the bipolar devices.

Next, silicide is formed on top of the poly in a self aligned process to improve its conductivity. Then P+ and N+ source and drain implants are performed for the MOS devices, contact windows are opened and metal is deposited to interconnect the cells so formed with other cells to form the system.

The process to form NPN devices and MOS devices of either channel type or CMOS devices then can be summarized as follows:

1. Form the buried layers under the bipolar devices and, preferably, under the MOS devices as well to provide better alpha particle protection;

2. Grow an epitaxial layer by low pressure chemical vapor deposition and do a boron implant to dope it as N type;

3. Form the isolation islands for the bipolar and MOS devices such as by an oxide/nitride sandwich deposition, mask and KOH etch followed by field oxidation;

4. Do a P type impurity base implant in the N type epitaxial layer while masking the collector contact regions of the bipolar devices and the MOS device channel regions if only P channel devices are to be formed and not masking the MOS active regions if only N channel devices are to be formed—if CMOS devices are to be formed, then only the P channel device active regions need be masked off during the implant;

5. Planarize to remove the bird's heads formed in the isolation oxidation process for both the MOS and bipolar devices if said process is used;

6. Grow a gate oxide over the channel regions of the MOS devices while masking off the active regions of the bipolar devices so that no oxide is grown there;

7. Deposit a layer of polysilicon over the whole surface of the wafer;

8. Implant the poly layer with both P and N type impurities using crude masks to form P+ and N+ areas in the poly layer where emitter, base and collector contacts are to be formed—mask off the MOS devices during the N type implant so that the poly over the MOS active region remains intrinsic for P channel devices but do not mask off the MOS devices during the P type implant for P channel devices such the poly over the MOS active region becomes doped P+—for the N channel devices reverse the masking sequence specified above for the P channel devices;

9. Deposit nitride and etch nitride to protect tops of poly regions which are to become the gate, source and drain contacts of the MOS devices and the emitter, base and collector contacts of the bipolar devices using silicide exclusion mask;

10. Mask and etch polysilicon to form desired contacts;

11. Form silicon dioxide over exposed areas of epi, poly and field oxide;

12. Etch the remaining nitride off the poly with an etching step that will attack nitride but not oxide;

13. Form a layer of refractory metal such as titanium over the entire surface of the wafer and heat treat to convert the metal in contact with poly into silicide—the heat treatment should be long enough to allow sufficient diffusion of the N type impurities in the emitter and collector poly contacts to diffuse into the underlying epi layer to form an emitter region and a collector contact of N+ concentration;

14. Remove the unreacted metal;

15. Implant P type impurities through the oxide over the bipolar active region to lower the base sheet resistance and through the oxide over the P channel devices to form P+ source and drain regions—mask off the N channel devices;

16. Mask off the bipolar devices and the P channel devices, and do an N type implant through the oxide over the N channel devices to form the source and drain regions of the N channel devices;

17. Planarize by any known technique such as by deposit of PVXII glass and reflow by heatpulse treatment;

18. Form contact holes for metallization for any metal lines that must be used to interconnect cells to other circuits in the system;

19. Deposit layer of metal and etch to form desired connectivity pattern.

BRIEF DESCRIPTION OF THE DRAWINGS

FIG. 21 illustrates an exemplary completed bipolar structure after the metallization pattern has been etched—the MOS structure after metallization would look similar.

DETAILED DESCRIPTION OF THE PREFERRED EMBODIMENT

Figure 1:
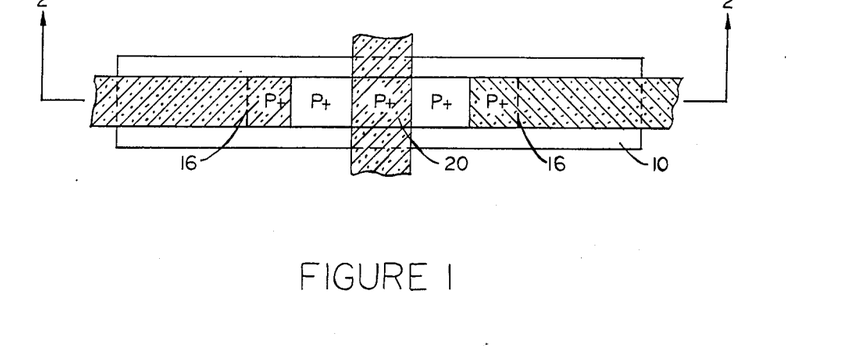
FIG. 1 shows a top view of an improved MOS transistor.
Figure 2:
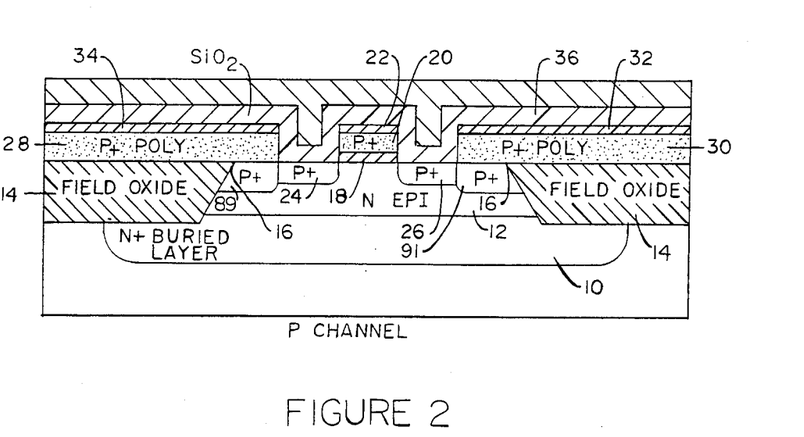
FIG. 2 shows a cross sectional view of the device of FIG. 1 taken along the section line 2—2'.

Referring to FIG. 1 there is shown a top view of an improved MOS device in accordance with one aspect of the invention. FIG. 2 shows the device of FIG. 1 in cross section along the section line 2—2'. The MOS transistor is formed over conventional buried layer 10 which is formed in a conventional manner. The buried layer 10 is not absolutely necessary to make a working MOS transistor, but its presence is preferred to provide better alpha particle immunity. Alpha particles are charged particles which can enter the structure from the surrounding environment. Their presence is a problem because in very small structures such as memory cells, the charge on the particle if bled into the circuit sometimes changes the electrical state of the circuit and can even change a logical 1 stored in a memory cell to a logical 0 or vice-versa. The presence of the highly conductive buried layer provides alpha particle protection. This is because the particles generally penetrate the structure deep enough to contact the buried layer and the charge on the particle then drains off harmlessly into it. The buried layer is generally grounded being in electrical contact with the substrate.

The buried layer is generally N+ doped in bipolar processes to make NPN transistors but would be P+ doped if PNP transistors were desired. For alpha particle protection in MOS devices, it does not matter which dopant is used to form the buried layer.

An epitaxially grown layer 12 of monocrystalline silicon is grown on the buried layer, and it is in this layer that the channel regions of the MOS devices and the active regions of the bipolar transistors will be formed. The isolation regions for the bipolar transistors are defined by thick field oxide regions which extend completely through the epi layer 12 and form a complete enclosure around a portion of the epi layer thereby forming an isolated island of epi which is not in electrical contact with its neighboring isolation islands. In bipolar transistors and CMOS this is necessary, but in MOS devices having only one channel type, such isolation regions are not necessary since MOS devices are self isolating. Therefore, although field oxide regions 14 defining boundaries 16 of an isolation island are shown in the MOS device of FIGS. 1 and 2, their presence is not absolutely necessary for proper functioning of the device unless bipolar and CMOS are to be made on the same substrate.

Positioned above the epi layer 12 and within the confines of the isolation island is a layer of gate insulating material 18 such as silicon dioxide. This layer serves to insulate a gate electrode 20 from a channel region of the epi layer 12 lying directly below the gate electrode 20. In the preferred embodiment, the gate electrode 20 is polysilicon doped to P+ conductivity. Positioned on top of the gate electrode 20 is a self aligned layer of silicide in electrical contact with the gate electrode. It is present to improve the conductivity of the gate electrode since silicide has a conductivity of about two ohms per square which is much better than the conductivity of doped poly.

On either side of the gate electrode 20 there are two self aligned P implanted regions 24 and 26 in the epi layer that serve as the source and drain regions of the MOS device. Contact to the source and drain regions 24 and 26 is made through two doped poly conductors 28 and 30. These poly lines are etched out of the same poly layer which was deposited to form the gate electrode 20. For a P channel device, the gate electrode and the source and drain poly lines are P+ doped. Self aligned layers 32 and 34 of silicide are formed on top of the source and drain conductors 28 and 30 to improve their conductivity. The advantage of using polysilicon for the gate and source and drain electrodes is that it lends itself to self aligned silicide formation processes and has a higher melting point than aluminum. Thus later high temperature steps in the process will not melt the conductors previously formed as would be the case if they were formed of aluminum.

Finally, a layer 36 of silicon dioxide or other insulator is deposited as by chemical vapor deposition over the entire structure to electrically insulate it from later metal layers that will be added for interconnection purposes and to protect the structure. Known methods and compositions can be applied to this silicon dioxide layer to planarize it so as to make later photolithography and metallization easier and more reliable. Planar structures are much more scalable, i.e., subject to redesign at smaller dimensions and with smaller clearances between features which are not supposed to touch each other. This is because there is less distortion caused by the conical depth of field problem in photolithographic light projection onto a planar surface than for light projection onto a surface with difficult, non-flat terrain features. That is, feature sizes and shapes do not distort much when projected onto planar surfaces whereas depth of field problems cause distortion when features are projected onto a non-flat surface. This can lead to inadvertant touching of features which are not supposed to touch each other when the design is scaled down to smaller dimensions and clearances. Structures which are not planar are therefore more difficult to scale down in size and cannot be scaled down as far as planar technologies.

The structure of FIGS. 1 and 2 is more scalable than conventional MOS structures with metal source and drain contacts, because the contacts for the gate, source and drain are all on approximately the same layer of the circuit since they are fashioned out of the same poly layer. In conventional MOS structures, the gate is formed and a layer of insulation is then formed over the whole structure. Then contact windows must be etched through the insulating layer down to the source and drain regions and the gate electrode. These contact windows take up space, must be properly aligned over their respective regions and require clearances around them such that the aluminum which will later be deposited in the holes does not inadvertantly contact structures which were not intended for electrical contact with that particular conductor. The alignment problems become very difficult as the device sizes become smaller since for very small features sizes, such as one micron, it is sometimes not possible to see alignment features even with the aid of microscopes. Further, even with a one micron process and one micron design rules, a contact hole of one micron by one micron requires that the area over which it is being lined up be larger than one square micron since clearances must be observed for manufacturing and mask fabrication variations from the specified size and for possible alignment errors during the photolithography process. It is apparent then that transistor structures that require contact holes for contact to the terminals of the device must have physically larger dimensions than devices which do not require contact holes.

Figure 3:
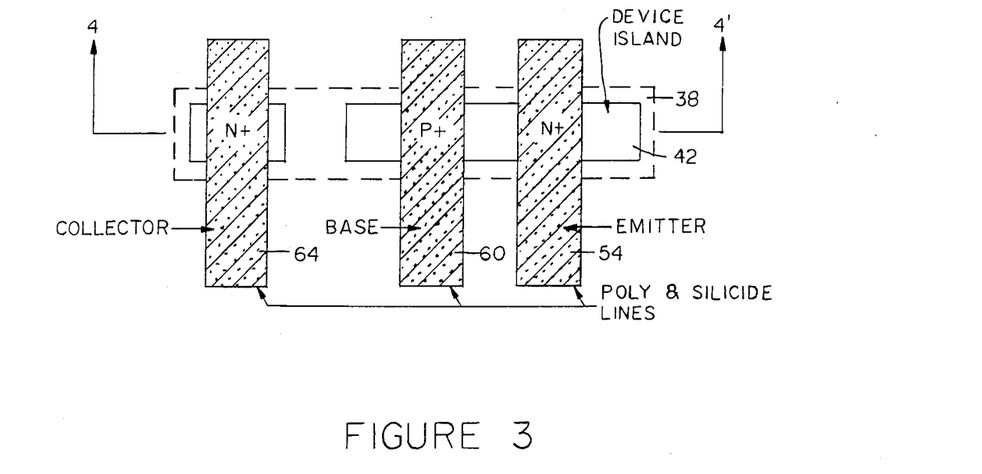
FIG. 3 shows a top view of a bipolar device of a single poly construction manufactured in accordance with the process of the present invention.
Figure 4:
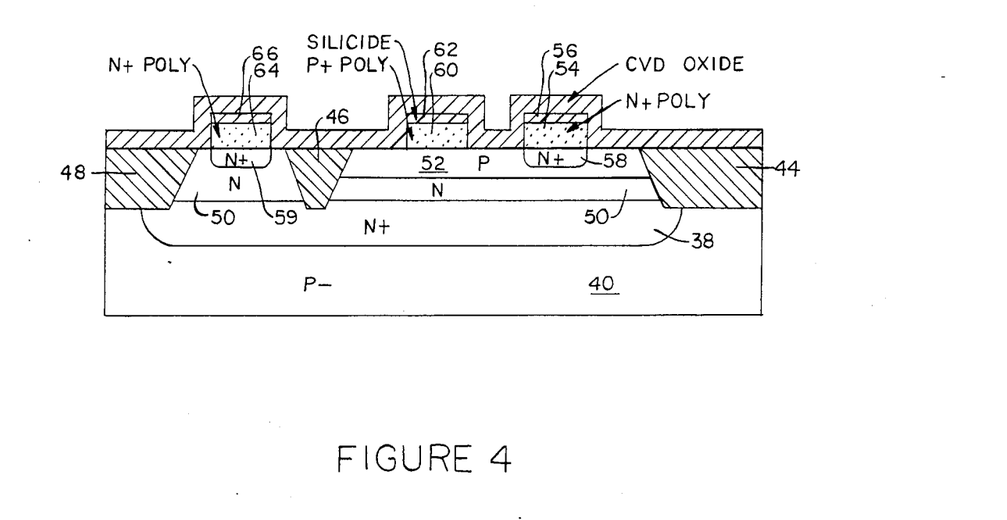
FIG. 4 shows a cross sectional view of the device of FIG. 3 along the section line 4—4' of a bipolar device of a single polysilicon layer construction manufactured with the process of the present invention.

FIG. 3 shows a top view of a bipolar device of a single poly construction which was manufactured in accordance with the process of the invention, and FIG. 4 shows a cross sectional view of the device of FIG. 3 as seen from the section line 4—4' in FIG. 3. A conventionally formed buried layer 38 is formed in the substrate 40. An epitaxially grown N type layer 50 of monocrystalline silicon is grown over the buried layer 38. Thereafter an isolation island 42 is formed in the epi layer 50 as defined by the edges of field oxide regions 44, 46 and 48. These isolation islands can be formed with any conventional isolation technique, but in the preferred embodiment, they are formed by using the well known Fairchild Isoplanar process.

For NPN transistors, a base region 52 of the N type layer is converted to P type by ion implantation or other known techniques. An N+ polysilicon emitter stripe 54 covered with a self aligned layer 56 of silicide to reduce its series resistance is formed over the device island 42. This poly stripe serves as the emitter contact for an N+ emitter region 58 formed in the base region 22. The emitter region 58 was formed when the silicide 56 was formed on the poly emitter stripe 54 by heat treating a metal which was deposited on the poly stripe 54. The heat causing the silicide to form simultaneously causes the N type impurities from the poly stripe to diffuse into the base region 52 thereby converting it from P type to N type.

The base contact is formed of a stripe of P+ doped polysilicon 60 having a self aligned layer of silicide formed on top of the poly stripe. Again the silicide reduces the series resistance of the base contact. A collector contact 64 comprised of a stripe of N+ doped poly is formed over the collector region defined by the field oxide regions 46 and 48. A self aligned layer 66 of silicide is formed over the poly stripe collector contact 64 to reduce its series resistance. The complete transistor structure is then coated with a layer of CVD oxide for insulation.

Both the devices of FIGS. 2 and 4 can be manufactured on the same die with a single process. The process steps for manufacture of the two devices are not identical, but there is enough overlap of the process steps needed for each type of device to render the two processes sufficiently compatible to be combined into one process having all the necessary steps. Of course some of the steps needed to make the MOS device are not needed to make the bipolar device, but masking can be used to prevent unneeded steps from affecting the devices to which they do not apply. A side by side analysis of the two processes will illustrate this point.

Figure 5:
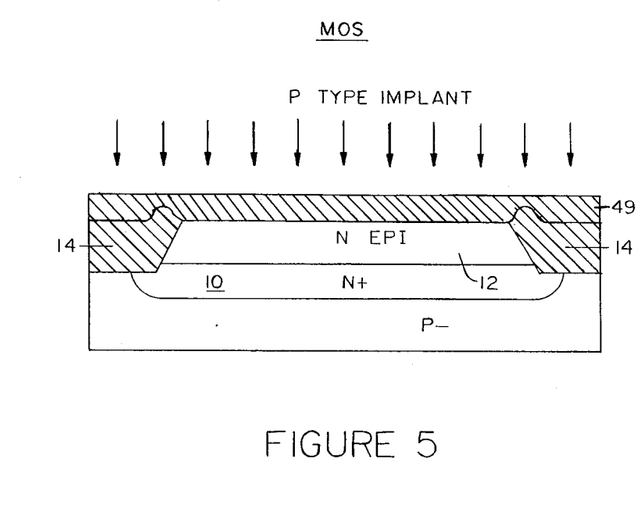
FIG. 5 shows a cross sectional view of the structure of FIG. 1 taken along the section line 2—2' at an early stage in the processing.

FIG. 5 shows a cross sectional view of the device of FIG. 2 after the buried layer 10 has been formed and the isolation island 16 has been formed as by the Fairchild Isoplanar $^{tm}$ process. This process is described in detail in U.S. Pat. No. 3,648,125 to Doug Peltzer. Other processes for isolation of any bipolar devices to be built on the same die can also be used, but isolation for MOS device is not necessary. The isolation island or active area of the transistor is that area enclosed within the boundaries 16 defined by the edges of the field oxide regions 14.

Figure 6:
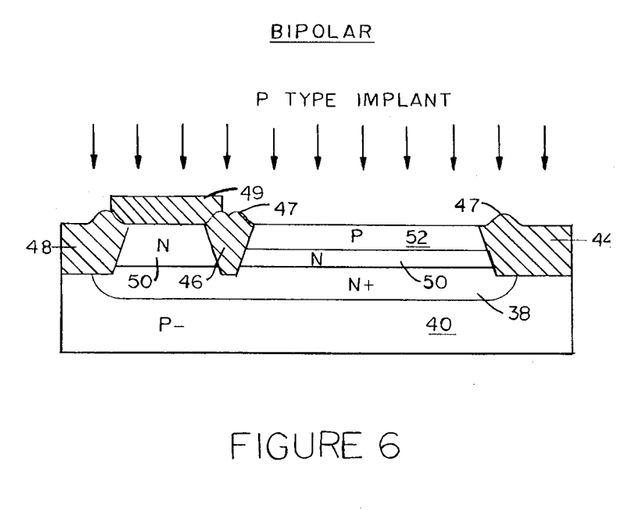
FIG. 6 shows, in cross section, an intermediate stage of the bipolar single poly process at approximately the same stage of completion as shown in FIG. 5.

FIG. 6 shows a cross sectional view of the structure of FIG. 1 along the section line 2—2' early in the processing sequence after the buried layer, and epi layer have been formed and isoplanar oxide isolation to form the field oxide regions 14 have been carried out. At the time in the process sequence shown in FIG. 5, the P type impurity base implant for the bipolar devices is being carried out. A layer of photoresist 49 is present in FIG. 5 to protect the epi layer 12 for reasons that are explained below in the discussion of FIG. 6.

In contrast, FIG. 6 shows, in cross section, an intermediate stage of the bipolar single poly process at approximately the same stage of completion as shown in FIG. 5 for the MOS device. FIG. 6 shows the bipolar device after the buried layer 38 has been conventionally formed in the substrate 40 and the epi layer 50 has been conventionally grown. Likewise, field oxide regions 44, 46 and 48 have been conventionally formed to define an active area or base region 52 and a collector region defined by the field oxide regions 46 and 48.

The conventional formation of the isolation islands leaves the bipolar structure as shown in FIG. 6 with small oxide protrusions 47 at the surface called bird's heads. These should be removed because planar structures create fewer photolithography and other topography related problems.

To form the base regions of the NPN bipolar transistors, P type impurities can be implanted or otherwise added to the top regions of the epi layer 50 in the active region between field oxide regions 44 and 46 to convert it from N type to P type. This step can be done at this stage of the processing or after planarization, and can be omitted if PNP transistors are to be formed. Of course for NPN transistors, the collector regions must remain N type, so a layer 49 of photoresist must be deposited, masked and developed over the collector regions to protect them from being changed to P type by the base implant. The MOS device active regions must be protected form this P type base implant if P channel devices are to be formed, because N type epi is needed under the gates for P channel devices. Thus, the photoresist layer 49 should be masked and developed to protect the active regions of all P channel MOS devices as shown in FIG. 6. For N channel devices, P type epi is needed under the gates, so these devices should not be masked from the base implant of P type impurities such the N type epi in the active regions of all N channel MOS devices will be changed to P type. This makes it easy to make high performance CMOS and bipolar on the same die. That is, by properly masking during the base implant, the P wells can be formed essentially for free, i.e., without any extra processing steps.

Figure 7:
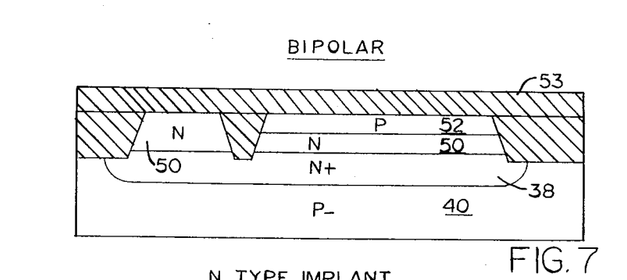
FIG. 7 shows, in cross section, the intermediate structure in the bipolar process after planarization has occurred.
Figure 8:
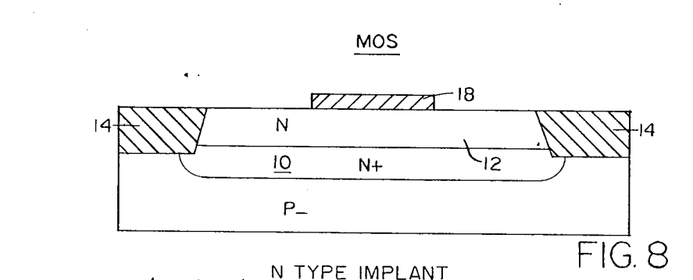
FIG. 8 shows the planarized intermediate stage of the MOS device after the gate oxide has been grown.

FIG. 7 shows the intermediate stage in the bipolar process after planarization has been done to remove the bird's heads at the surface of the field oxide regions. This planarization is not absolutely necessary, because the polysilicon to be deposited next will cover the bird's head with no problem of cracking etc. However, the planarization step does improve the later planarization of the structure after subsequent steps since the bird's heads structure will be echoed more or less in subsequent layers. The planarization step or steps can be any known planarization process such that described in a pending U.S. patent application by Gregg Burton entitled "Bird's Head Planarization Process", Ser. No. 576,665, filed 2/3/84 which is hereby incorporated by reference. A layer of photoresist 53 is shown over the bipolar device to protect the exposed epi area from oxidation during growth of the gate oxide 18 in the MOS devices. This photoresist layer is deposited after the planarization and before the gate oxide growth, and can double as the photoresist for the masking step to grow the gate oxide 18 in FIG. 8. FIG. 8 shows the MOS structure after this layer of photoresist 53 has been exposed and developed by the gate oxide mask and after the gate oxide has been grown and the remnants of the photoresist layer 53 have been stripped off the wafer.

FIG. 8 shows an intermediate stage of the MOS device after the resist that shielded the active regions of the P channel devices during the P type bipolar base implant is stripped off the wafer and after a thin layer of gate oxide 18 is grown over the active area. This gate oxide can be any thickness depending upon the desired characteristics of the MOS devices, but it is typically 1000 angstroms thick. The gate oxide should completely cover the portion of the active region which will be covered by the gate electrode.

Prior to growing the gate oxide 18, a planarization step should be performed on the MOS device field oxide bird's heads if oxide isolation is used to isolate the MOS devices. This planarization can be performed in identical fashion to the known planarization step used on the bipolar devices.

Figure 9:
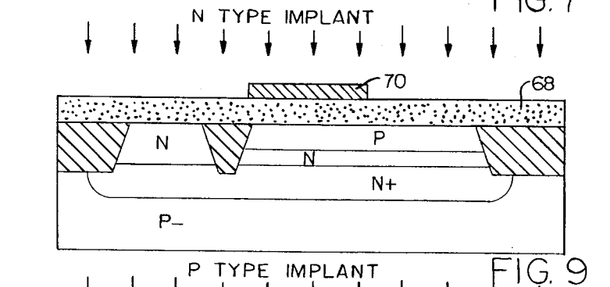
FIG. 9 shows the N type implant step into a layer of polysilicon previously deposited to form emitter and collector contacts for the NPN bipolar devices.

FIG. 9 shows an intermediate step in the bipolar process for doping the polysilicon layer 68 which has been deposited all over the surface of the wafer to form emitter and collector contacts for NPN transistors. The poly layer 68 can be deposited in any known manner such as by chemical vapor deposition. The poly must be doped with impurities to further increase its conductivity to reduce the resistance of the contacts to be formed out of this poly layer.

Bipolar single poly transistors need contacts of N+ poly and P+ poly; N+ areas must be formed for the emitter and collector contacts, and P+ areas must be formed for the base contact. Therefore two implants must be made with portions of the poly layer masked off from the implant ions. A layer of photoresist 70 which has been imaged with an N type of implant mask and developed is placed over the portion of the poly which is to be implanted with P type impurities, i.e., the base contact in an NPN device. This implant mask can be very crude and sloppily aligned since there is much tolerance for mask dimension and alignment errors at this stage of the process. After the resist layer 70 is placed, the ion implantation step is performed with a low to medium energy implant. The thickness of the resist layer 70 must be such as to withstand the implant energy level.

Of course if polysilicon resistors are to be used in the design, then an N− implant must be performed with its associated mask step. This implant may be done at this stage of the process. Also, if polysilicon diodes are to be used in the design, then these areas of the poly should be implanted to form the desired junctions between N+ and P+ regions.

Figure 10:
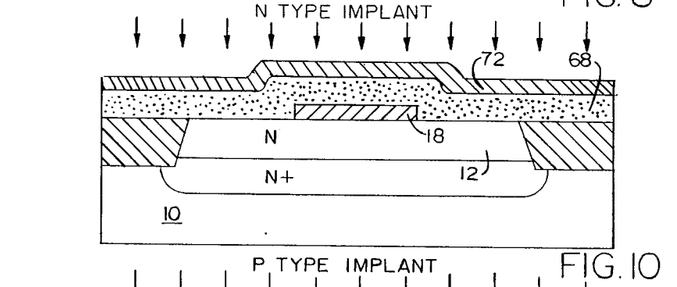
FIG. 10 shows the intermediate stage of the MOS device during the N type implant after the poly layer has been deposited.

FIG. 10 shows the MOS structure at an intermediate stage during the N type implant of FIG. 9. For a P channel device, P+ poly source and drain contacts are desired. Thus the poly over the MOS device must be shielded during the N type implant for the bipolar devices. To do this a layer of photoresist 72 is deposited and developed over the layer of polysilicon 68 which was deposited earlier at the same time the poly layer 68 for the bipolar devices was deposited. The photoresist 72 covers the entire MOS device in this case because a P channel device is being formed and P+ poly is needed for the contacts of such a device. If an N channel device is being formed, then the photoresist layer 72 would not be present so that all the poly layer 68 would be doped N+ in conductivity. Typical N+ conductivity levels are 100 ohms per square while N− conductivity is typically 1000 ohms per square. The P+ poly conductivity is typically 250 ohms per square.

Figure 11:
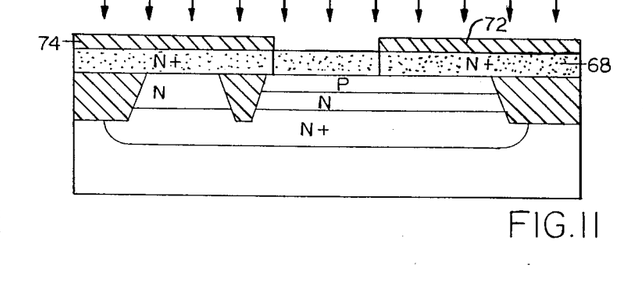
FIG. 11 shows the bipolar device during the P type implant of the polysilicon layer.

FIG. 11 shows the bipolar device during the P type impurity implant of the poly layer 68 to dope the region therein which will ultimately become the base contact. Another inexpensive mask is used to expose areas of a layer of photoresist which is deposited on the wafer to form photoresist layers 72 and 74 which cover the portions of the poly layer 68 which were previously doped N+. This implant dopes the region of poly between the photoresist layers 72 and 74 P+ in conductivity. It is possible that diffusion of impurities into the polysilicon could also be used for the doping steps shown in FIGS. 9, 10, 11 and 12, but implanting is preferred.

Figure 12:
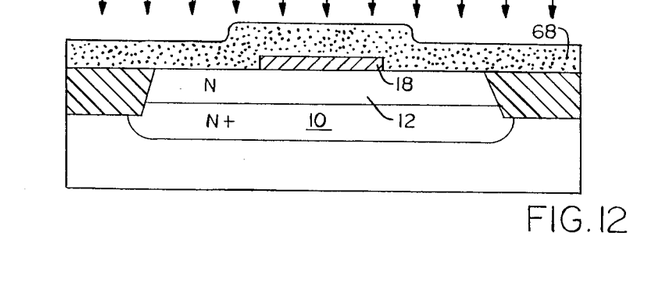
FIG. 12 shows the MOS device during the P type implant.

FIG. 12 shows the MOS device during the P type impurity implant. The layer of photoresist 72 has been stripped off such the poly layer 68 over the gate oxide and thea ctive region are exposed to the bombardment of P type impurities to dope the entire poly layer 68 P+ in conductivity.

Figure 13:
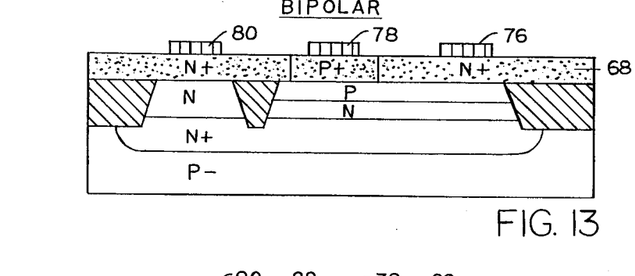
FIG. 13 shows the bipolar device after nitride deposit and etch.
Figure 14:
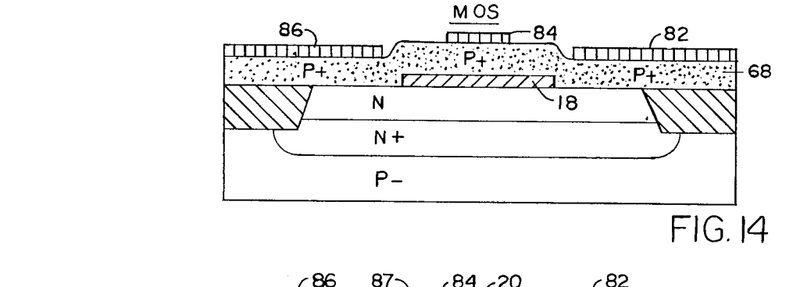
FIG. 14 shows the MOS device after the nitride deposit and etch.

The polysilicon layer 68 in both the bipolar and the MOS devices must now be etched to form the various contacts to the device nodes. FIG. 13 shows an intermediate stage in this process for the bipolar devices, while FIG. 14 shows the same intermediate state for the MOS devices. To etch the poly, first a layer of nitrode (not shown) is deposited over the entire poly layer 68. A mask is then used to expose a layer of photoresist which is deposited over the nitride layer, and the photoresist is then developed to leave photoresist regions over the areas of nitride which are not to be etched away. A wet etch solution of phosphoric or aqueous hydrofluoric acid is then used to etch away the portions of the nitride layer which are not protected by the photoresist. This leaves the structure as shown in FIG. 13. Note that the regions of nitride 76, 78 and 80 left after the etch are positioned over what will become the portions of the poly layer 68 which will become, respectively, the emitter, base and collector contacts.

FIG. 14 shows the corresponding stage in the processing of the MOS devices. The steps are identical to those described above with respect to FIG. 13 for depositing and etching the nitride regions 82, 84 and 86. These regions of nitride are positioned respectively over the portions of the poly layer 68 which will become the source, gate and drain contacts.

Figures 15, 17:
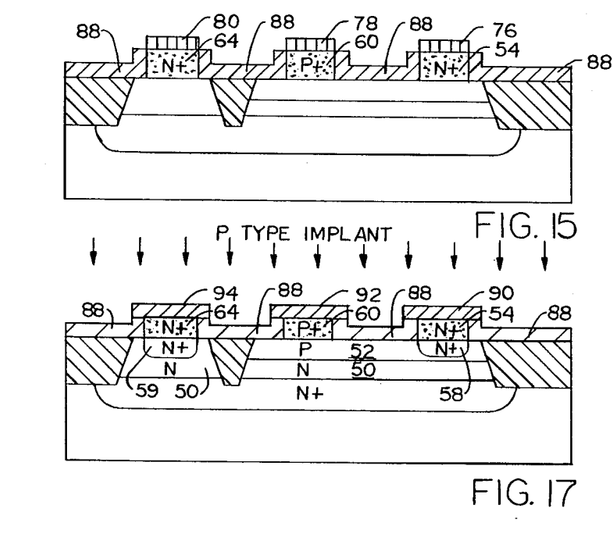
FIG. 15 shows the bipolar device after the poly etch and selective oxidation steps.
FIG. 17 shows the bipolar device after nitride etch and silicide formation.

FIG. 15 shows the device after the poly etch and a selective oxidation step. After the nitride etch step in FIG. 13, it is time to form the emitter, base and collector contacts. This is done by using the nitride regions 76, 78 and 80 as etch masks for the poly layer 68. The poly can be either wet or dry etched in a known manner. Typical wet etching solutions include hydrofluoric acid, HNo3, acetic acid and KOH. This leaves the three poly strips 54, 60 and 64 shown in plan view in FIG. 3 and in cross section in FIG. 15. The surface of the wafer is exposed between these three poly strips and is selectively oxidized by either heat treating the wafer in an oxidizing ambient to create the oxide layer 88 or depositing an oxide by CVD or LPCVD. Note that the sidewalls of the polysilicon contacts 54, 60 and 64 are also oxidized in this step.

Figures 16, 18:
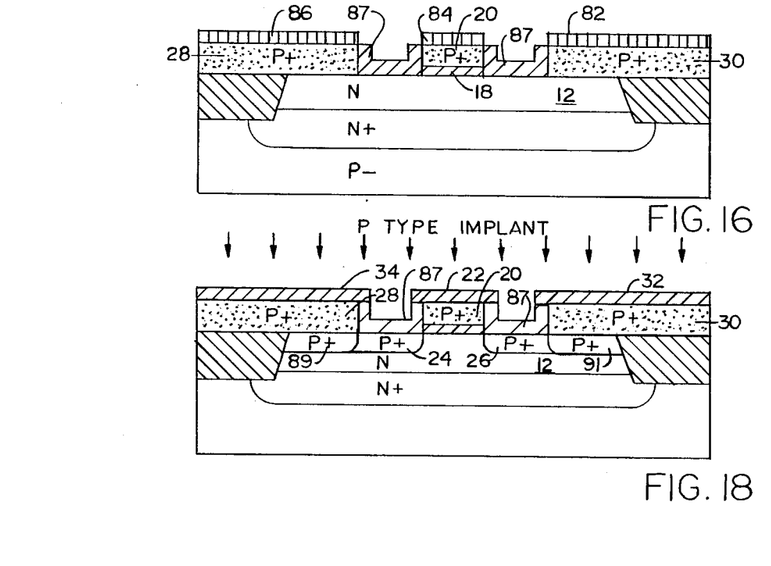
FIG. 16 shows the MOS device after the poly etch and selective oxidation.
FIG. 18 shows the MOS device after nitride etch and silicide formation.

FIG. 16 shows the stage in the processing of the MOS devices after the poly layer 68 is etched to begin formation of the source, gate and drain contacts. The nitride regions 82, 84 and 86 are used as poly etch masks for a wet or dry etch of the poly layer 68 to form the contacts 30, 20 and 28. If a wet etch is used, an etchant such as hydrofluoric acid must be used that will also attack silicon dioxide so as to self align the edges of the gate oxide 18 with the edges of the poly contact 20. The etch must be stopped before too much epitaxial silicon is removed. The nitride regions still remain on top of the poly after the etch. The exposed regions of the epi layer 12 and the sidewalls of the polysilicon contacts 30 and 28 and the sidewalls of the gate electrode 20 are then selectively oxidized by heat treating the wafer in an oxidizing ambient atmosphere.

FIG. 17 shows the bipolar device after the nitride is etched away and the silicide is formed. The remaining nitride is etched away with an etchant that will attack nitride but not oxide. After the nitride is removed, a layer of titanium or other refractory metal is deposited over the wafer surface and a heat pulse silicide formation step is used to create silicide. The silicide will be formed in self aligned fashion only on top of the polysilicon contacts 54, 60 and 64 to form silicide contacts 90, 92 and 94. No silicide will be formed anywhere else because silicide only forms where metal is in contact with silicon when heated. All other areas other than the areas on top of poly contacts 54, 60 and 64 are protected by oxide. After the silicide formation step, the remaining unreacted metal is etched off the wafer with an etchant that will not attack silicide. This is relatively easy since the unreacted metal is not tightly bound to any oxide under it. This step removes all conducting material connecting the silicide regions 90, 92 and 94.

During the heat treatment to selectively oxidize the exposed poly and epi regions in FIG. 15 and the heat pulse to form the silicide, some of the N type dopants from the emitter contact 54 and the collector contact 64 diffuse into the epi layer. This forms the emitter region 58 inside the base region 52 and the collector contact region 59 inside the epi layer 50.

After, the removal of the remaining unreacted refractory metal, a P type impurity implant is performed, as shown in FIG. 17, to implant the surface of the base region 52 in the bipolar device with extra P type impurities. The silicide regions 90, 92 and 94 and the poly underlying these regions serves as a mask for this implant. The implant energy must be such to penetrate the oxide layer 88. The purpose of this implant in the bipolar device is to reduce the sheet resistance of the base region.

FIG. 18 shows the MOS device after nitride etch and silicide formation. The steps are identical to the steps described above with reference to FIG. 17. This leaves silicide regions 32, 22 and 34 on top of polysilicon contacts 30, 20 and 28. The heat treatments to form the silicide also cause some of the P type dopants in the poly contacts, 30 and 28 to diffuse into the underlying epi layer 12 to form the P+ regions 89 and 91 which form part of the source and drain contacts.

After the removal of the unreacted refractory metal in FIG. 18, a P type implant is performed to form the source and drain regions of the P channel MOS device. Of course, if an N channel device is desired, the MS device must be covered with a masking layer such as photoresist during the P type impalnt for the bipolar device to reduce the base sheet resistance. If a P channel device is being formed, the silicide regions 32, 22 and 34 and the underlying poly serve as a mask for this implant such that the P+ source and drain regions 93 and 95 formed by the implant in the epi layer 12 are self aligned. If an N channel device is to be formed or if CMOS is being formed, then an extra implant step for N type impurities is needed for these devices. This step is identical to the P type implant described above, but is not needed for the bipolar devices. In either event, the implant energy msut be such that the ions can penetrate the oxide layer 87 to reach the epi layer 12.

Figure 19:
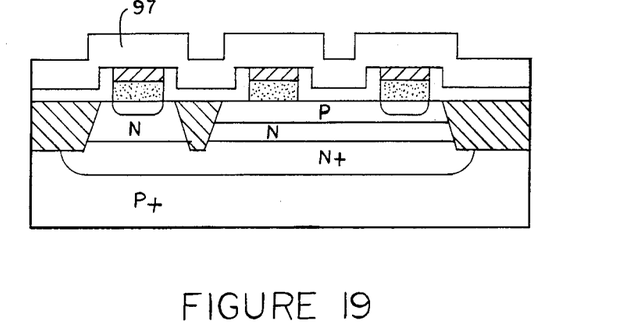
FIG. 19 and 20 show the planarization step for either the bipolar or the MOS devices.
Figure 20:
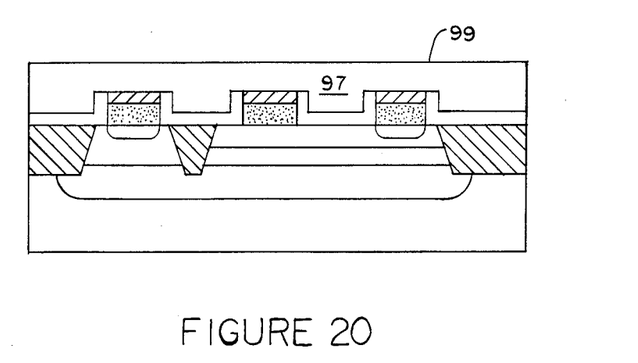

FIGS. 19 and 20 show the planarization steps prior to cutting of contact windows and metallization for either the MOS or bipolar devices. Although only the bipolar devices are shown, the steps are identical for the MOS devices, and those skilled in the art will appreciate how these steps can be done for the MOS devices. The first step, shown in FIG. 19 is to deposit a composition glass layer 97. The composition of this glass and its application are described in a U.S. Pat. No. 4,490,737 issued to John Pierce and William Lehrer which is hereby incorporated by reference. This glass has the property that its reflow temperature is lower than other conventionally used glasses because of the presence of the germanium. Further, its thermal coefficient of expansion closely matches that of the structure below it so as to reduce the probability of stress cracking under thermal stress. After this glass is deposited, a heatpulse step is used to cause it to reflow and flatten the topography of the device to leave the flat surface 99. This step is also more fully described in the above noted patent application.

Figure 21:
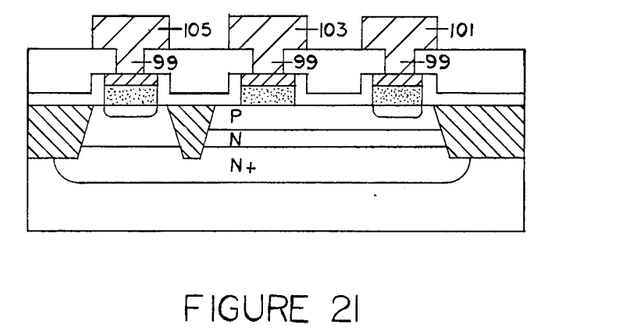

After the planarization step, photolithography processes are used to cut contact holes 99 as illustrated in FIG. 21 in the glass layer over all device terminals such as the emitter, base and collector contacts in the bipolar devices, and the gate terminal and the source and drain contacts of the MOS devices. Of course, alignment difficulties in masking for these contact holes can be eased if the silicide covered poly contacts are extended outside the transistor active area and expanded in area to provide a pad for the contact hole which is easier to use for alignment purposes. Thereafter, metal is deposited over the wafer to fill in the contact holes and the circuit pattern is photolithographically formed in the metal layer to form the exexmplary metal lines 101, 103 and 105. The procedures for these steps will be apparent to those skilled in the art and will not be detailed here.

As noted above, the process defined herein can also be used to make N channel MOS device or CMOS comprised of both N channel and P channel devices on the same die either with or without using the process to make bipolar devices on the same die. Only the P channel process steps have been illustrated above for brevity. The following are the process steps to make N channel devices. These process steps will be illustrated in terms of the modifications that would have to be made to the masking illustrated in the figures associated herewith to result in an N channel device and a bipolar device at the end of the process sequence. Those skilled in the art will understand that by following the processing steps illustrated in FIGS. 5–21 at certain locations on the die and by following the process steps detailed below at other locations on the die, it is possible to make a die with both high performance bipolar and high performance CMOS devices present at desired locations. Also, by eliminating the steps needed solely for making the bipolar devices, it is possible to use the process to make only high performance CMOS devices without making any bipolar devices.

To make a high performance N channel device using the above described process, the N+ buried layer 10 and N type epitaxial layer "epi" 12 are conventionally formed and the isolation field oxide regions 14 are formed in the same manner as for manufacture of a P channel device. This forms the buried layer needed for alpha particle protection of the N channel device and an isolation island to isolate it from any P channel or bipolar devices being formed nearby. The N type epi layer 12 must be converted to a P doped epi region to make an N channel device however, so a P type doping step must be performed. This is accomplished by using the P type base implant depicted in FIG. 6 to reverse the doping of the N epi layer 12 in FIG. 5. To do this of course the photoresist layer 49 must not be present over any isolation islands to be converted to N channel devices. Those skilled in the art will appreciate that this P type implant must be done with sufficient energy to create a suitable junction depth for the P region created thereby and the dosage must be sufficient to change the conductivity from to N to P. These parameters are matters of design choice based upon the desired characteristics for the devices being manufactured and are well known.

Next, the field oxide region 18 must be grown. The process steps for this stage of the process are well known and are identical to the process steps associated with FIG. 18. Note that the bipolar device isolation islands are masked off during this gate oxide formation step. Typically it is thermally grown in a very clean oxygen ambient, i.e., free of contamination, in a furnace at 1000 degrees centigrade, but other processing conditions which create a high integrity oxide layer 18 will also suffice.

Next comes the deposition of polysilicon layer 68 shown in FIG. 10 followed by an N type implant. To make an N channel device, the photoresist layer 72 would be absent over all isolation islands for N channel devices. This results in an N+ doped polysilicon layer 68 from which the source, drain and gate electrodes can be formed.

An implant of P type dopants is needed to form the bipolar devices since they need both N and P type polysilicon contacts, but this P type implant is not needed to form an N channel device. Thus, in FIG. 12 a photoresist layer would have to be added to protect the polysilicon deposited over all isolation islands which were to contain N channel devices.

Next, contacts must be formed in the polysilicon layer 68. To do this, the nitride layers 82, 84 and 86 in FIG. 14 must be deposited and patterned. This is done in an identical fashion as described with reference to FIG. 14 regardless of whether a P channel or N channel device is being formed. The etching and oxidation steps performed to get to the configuratin shown in FIG. 16 are identical also regarless of whether an N channel or P channel device is being formed.

Silicide formation of layers 32, 22 and 34 is performed next, and is done in the same fashion as described in connection with FIG. 18 regardless of whether an N channel or P channel device is being formed. Note that during the heat pulse treatment to form the silicide, some of the impurities from the polysilicon source and drain contacts 28 and 30 outdiffuse from the poly into the underlying epi to form the extensions 89 and 91 of the source and drain regions 26 and 24.

Following silicide formation, an N type implant through the oxide regions 87 must be performed to form N+, self-aligned source and drain regions 26 and 24. Thus, in FIG. 18, a layer of photoresist must be added to protect the N channel devices from the P type implant, and an extra N type implant (not shown) must be performed after uncovering all isolation islands to become N channel devices and covering all isolation islands to become P channel devices with photoresist.

In some embodiments the silicide formation could be done after implanting the sources and drains, but this could cause dopant migration problems. That is, the impurities implanted in the regions 24 and 26 might diffuse somewhat during the heat pulse used to form the silicide thereby changing the device structure and characteristics. That is why formation of the silicide before performing the source and drain implant is preferred.

That completes formation of the N channel device except for passivation, etching of contact holes and metallization. These steps are identical to the steps described above with reference to FIGS. 19–21 regardless of whether an N channel or P channel device is being formed.

Figure 22A:
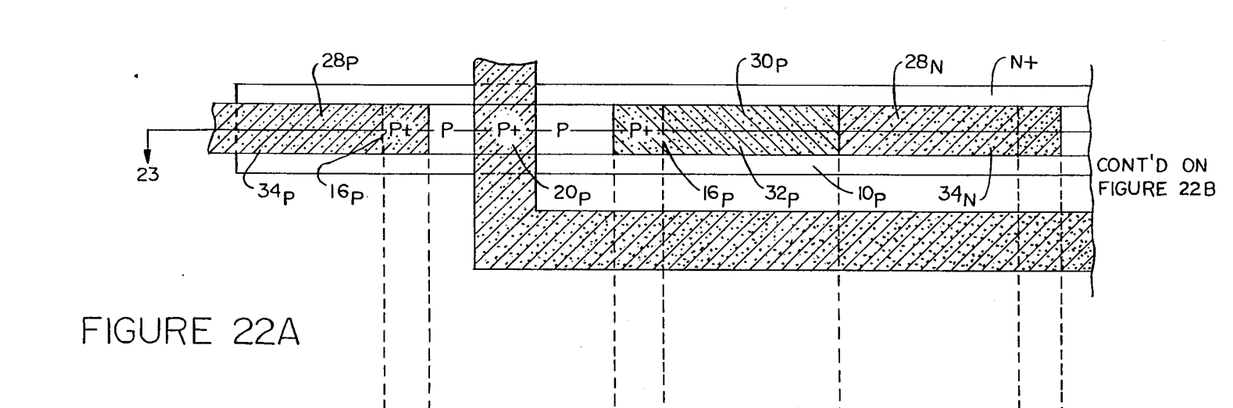
FIGS. 22A and 22B show a top view of an exemplary CMOS and bipolar structure.
Figure 22B:
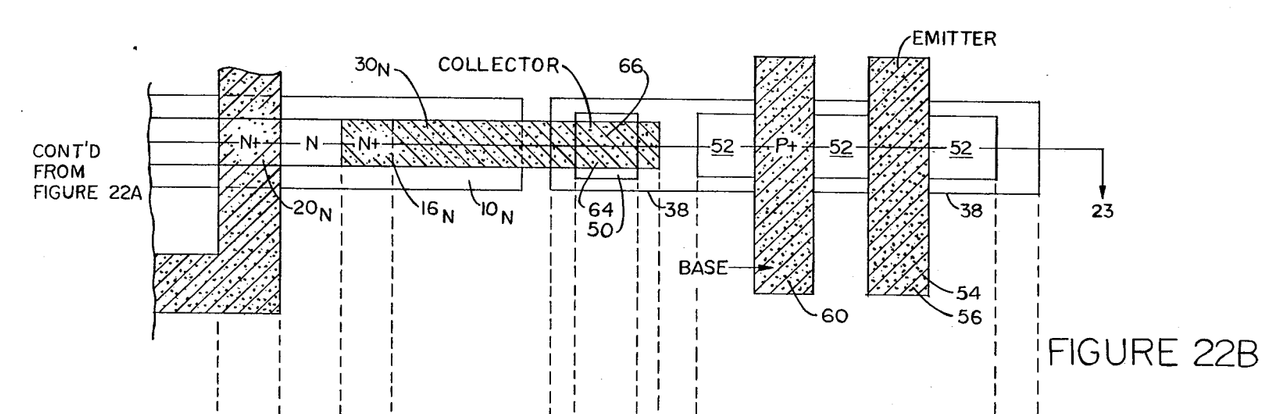
Figure 23A:
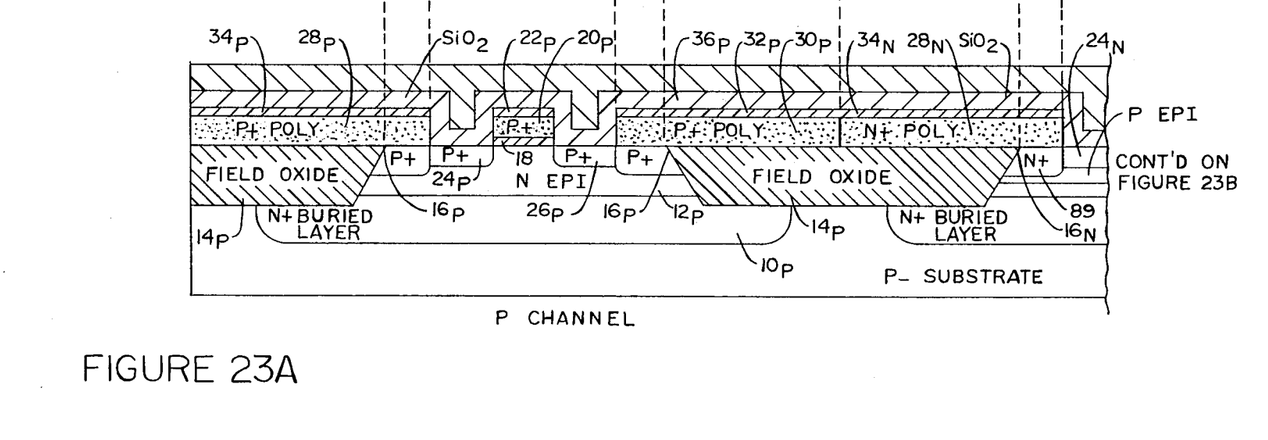
FIGS. 23A and 23B show a cross section of the devices shown in FIGS. 22A and 22B.
Figure 23B:
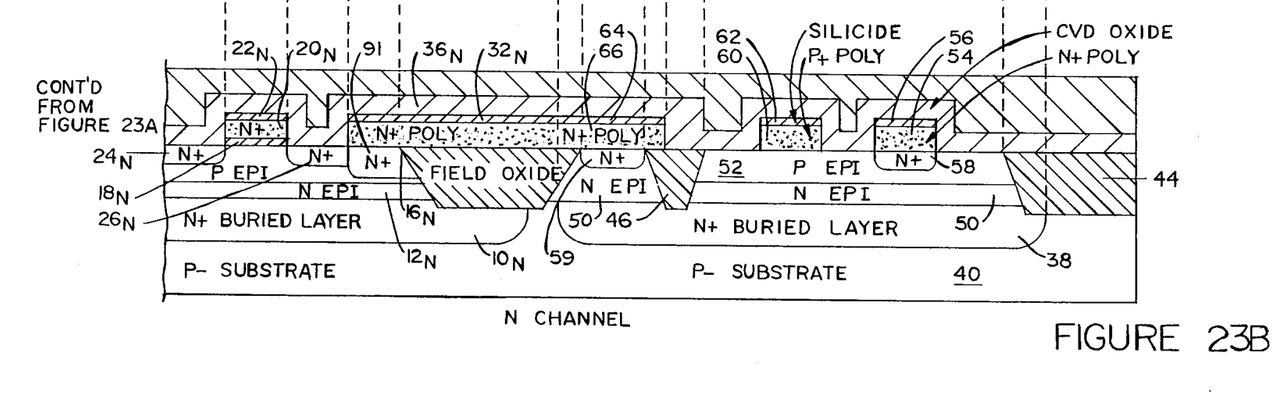

FIGS. 22A and 23A show in cross section a final structure of one bipolar device, an N channel MOS device and a P channel MOS device all formed in adjacent isolation islands. All reference numerals denote the same structures previously indicated in FIGS. 5–21, except that the N channel MOS device structures have subscript N's to distinguish them from the analogous structures having the same root reference numerals in the P channel device figures. The structures of the P channel device have a subscript P to distinguish them from the N channel structures serving the same purpose for the N channel device. Of course a metallization pattern (not shown) and the polysilicon and silicide conductors can be configured to implement any circuit desired. The circuit shown is exemplary only, and those skilled in the art will understand that many different circuit configurations utilizing high performance bipolar and CMOS devices on the same die can be designed.

It will be apparent to those skilled in the art that numerous modifications of the above described processes and structures can be made without departing from the spirit and scope of the invention. All such modifications are intended to be included within the scope of the claims appended hereto.

What is claimed is:

1. A process for forming MOS and bipolar devices on the same integrated circuit substrate in which there have been formed in selected locations buried layers, an epitaxial silicon layer and isolation regions in said epitaxial layer surrounded by field oxide to isolate a bipolar transistor active areas for base regions, bipolar transistor collector contact regions and active regions for NMOS devices and active regions for PMOS devices comprising the steps of:
   (1) doping the base regions and predetermined MOS active regions with impurities of a conductivity type selected to create the desired conductivity for a base region for a selected type of bipolar transistor and for a channel region for a selected type of MOS transistor;
   (2) forming a gate oxide layer over all MOS channel regions while preventing oxidation of the isolation regions for all bipolar devices;
   (3) depositing a layer of polysilicon over the surface of said substrate;
   (4) doping selected areas of said polysilicon with N type impurities and selected areas with P type impurities;
   (5) etching the doped polysilicon areas using a mask so as to form source and drain contacts and gate contacts for MOS devices and emitter, base and collector contacts for bipolar devices and interconnects between transistor contacts and other nodes in the circuit to form a user defined circuit and wherein each of said contacts has an area over its associated transistor active area which is smaller than the area needed to form the smallest possible contact window using the process used to make the transistors plus the associated alignment tolerances on all sides of said contact window;
   (6) doping regions in said epitaxial layer adjacent the gate electrodes of a first selected group of MOS devices with P type impurities and a second selected group of MOS devices with N type impurities;
   (7) heating the structure to drive impurities from said doped polysilicon contacts into the underlying epitaxial layer.

2. The process of claim 1 further comprising the steps of:
   performing step 1 using an ion implant for the base region which has an energy level and dosage selected by the user to get the desired base doping profile and the desired base region penetration into said epitaxial layer;
   forming a layer of oxide over the areas of epitaxial silicon exposed by step 5 in claim 1;
   removing the remaining masking material left over from step 5 in claim 1 to expose the tops of the polysilicon contacts;
   depositing a layer of refractory metal capable of forming a silicide on the structure;
   heat treating the structure to form silicide wherever the metal is in contact with polysilicon;
   removing the unreacted metal;
   proceeding to step 6 in claim 1 and completing the process from step 6 but wherein step 7 includes the steps of heating the structure for a user defined time and at a user defined temperature so as to get outdiffusion of impurities in said doped polysilicon so as to obtain the desired depth for the emitter and the desired base width.

3. The process of claim 1 wherein the step 6 doping with P type impurities is an implant with energy sufficient to penetrate the oxide covering both the active regions of the NPN bipolar devices and the regions adjacent the gate electrodes of selected MOS devices and wherein the remaining MOS devices are masked from said P type implant and any PNP device active regions are masked to prevent implantation.

4. The process of claim 1 wherein the step 6 doping with N type impurities is an implant with energy sufficient to penetrate the oxide covering both the active regions of the PNP bipolar devices and the oxide regions adjacent the gate electrodes of selected MOS devices and wherein the remaining MOS devices are masked from said N type implant and any NPN device active regions are masked to prevent implantation.

5. The process of claim 1 wherein step 5 comprises the steps of:
   depositing a layer of nitride over the polysilicon layer;
   depositing a layer of photoresist on said nitride layer;
   exposing selected areas of said photoresist to radiation through a mask to harden the resist in selected areas wherein the areas exposed are selected so as to leave nitride over the poly at the location of the emitter, base, and collector contacts for the bipolar devices and the gate electrode-gate contact and the source and drain contacts of the MOS devices;
   dissolving the unhardened resist;
   etching away the nitride not protected by resist;
   etching away the polysilicon not protected by nitride; and
   depositing silicon dioxide or some other insulation material in the regions exposed by the etching of the polysilicon.

6. The process of claim 5 further comprising the steps of:
   forming a layer of oxide over the areas exposed by the polysilicon etch step of step 5 in claim 1;
   removing the remaining masking material left over from the poly etch step of step 5 in claim 1 to expose the tops of the poly contacts;
   depositing a layer of refractory metal capable of forming a silicide on the structure;
   heat treating the structure to form silicide wherever the metal is in contact with polysilicon;
   removing the unreacted metal;
   proceeding to step 6 in claim 1.

7. A process for forming CMOS and bipolar devices on the same integrated circuit substrate comprising the steps of:

forming isolation regions for all bipolar and MOS devices in an epitaxially grown layer of silicon on said substrate;

forming gate oxide layers in the isolation regions of all MOS devices;

forming a layer of polysilicon doped N type in selected areas and P type in other selected areas;

forming all needed contacts to transistor nodes and gate electrodes out of said polysilicon; and doping the regions in the MOS isolation regions adjacent to said gate electrodes and under said poly contacts with selected impurities.

8. The process of claim 7 further comprising forming self aligned silicide regions on top of all poly contacts and gate electrodes.

9. The process of claim 8 further comprising the steps of planarizing the structure, opening contact windows for metallization, depositing a layer of metal over the structure and etching the metal to the desired connections.

* * * * *